United States Patent [19]

Wallick

[11] 4,003,125
[45] Jan. 18, 1977

[54] APPARATUS FOR MANUFACTURING DUAL IN-LINE PACKAGES
[75] Inventor: Charles W. Wallick, York, Pa.
[73] Assignee: E. I. Du Pont de Nemours and Company, Wilmington, Del.
[22] Filed: Nov. 3, 1975
[21] Appl. No.: 628,367
[52] U.S. Cl. .......................... 29/569 R; 29/33 R; 29/753; 29/576 S; 29/591
[51] Int. Cl.² .................................... H01L 21/28
[58] Field of Search ......... 29/33 R, 193.5, 203 DT, 29/203 DS, 203, 576 S, 591, 569; 228/41, 4.5, 5.1, 5.5, 5.7, 6 R, 6 A, 180 A; 357/70; 174/52 FP

[56] References Cited
UNITED STATES PATENTS

| 3,184,950 | 5/1965 | Sitz | 29/203 DS |
|---|---|---|---|
| 3,506,411 | 4/1970 | Robins | 29/203 DS |
| 3,627,190 | 12/1971 | Ramsey | 228/180 A X |
| 3,750,252 | 8/1973 | Landman | 29/193.5 X |
| 3,863,320 | 2/1975 | DeLisle | 29/203 B |

Primary Examiner—Othell M. Simpson
Assistant Examiner—Fred A. Silverberg

[57] ABSTRACT

Apparatus for manufacturing dual in-line packages from a single continuous lead frame assembly and a number of leadless circuit modules. The apparatus includes a loading station where modules are positioned in spaces in the lead frame assembly, a closing station where leads carried by spaced carrier strips on both sides of the modules are moved toward the modules to engage the modules adjacent metalized pads and to collapse interconnecting rungs, a soldering station where the leads are soldered to the pads, a bending station where the leads are bent down with respect to the module through about 90 degrees, a cut off station for removing the carrier strips on either side of the lead frame assembly, and associated drives for moving the lead frame assembly past the various stations.

13 Claims, 27 Drawing Figures

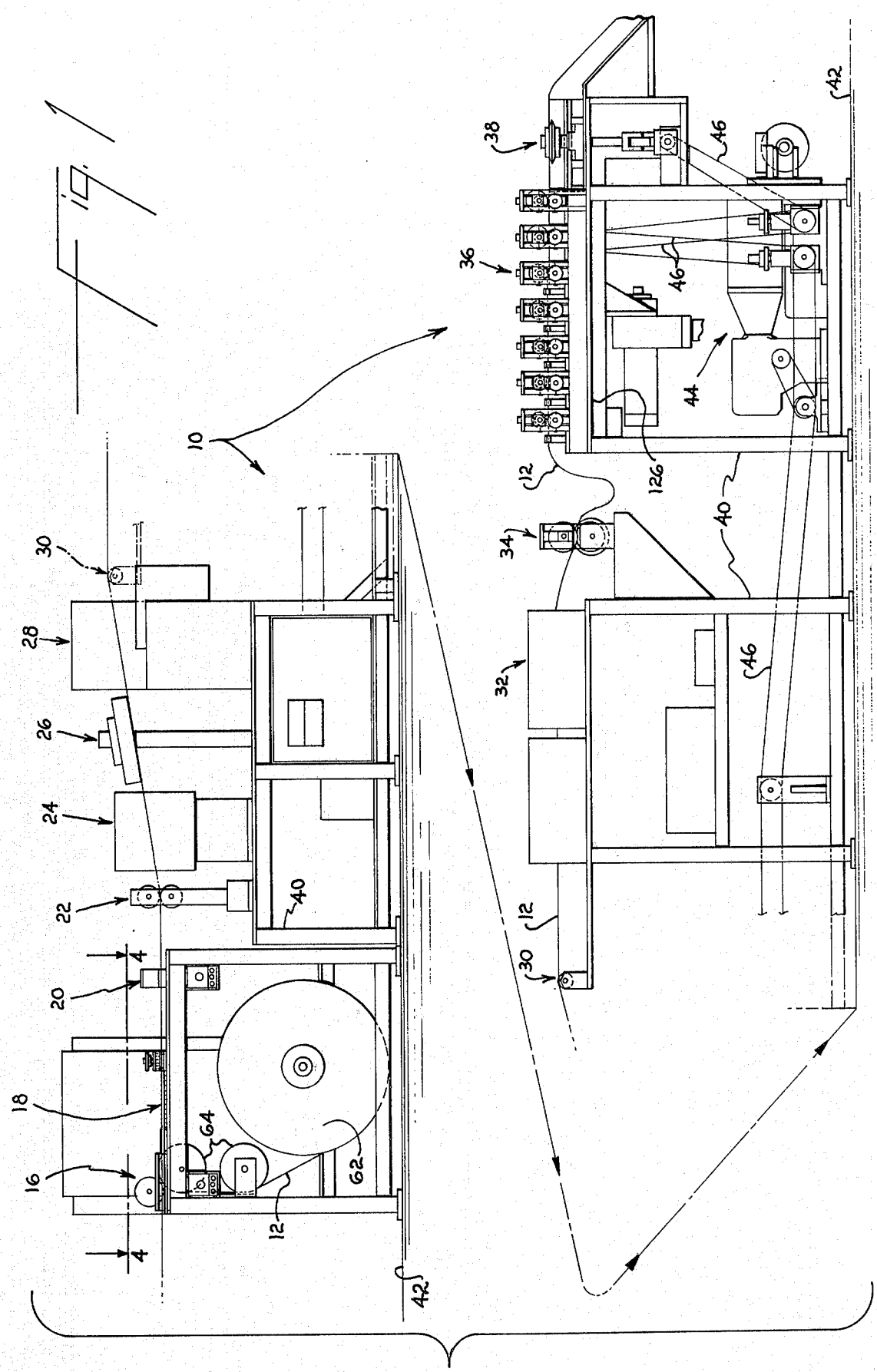

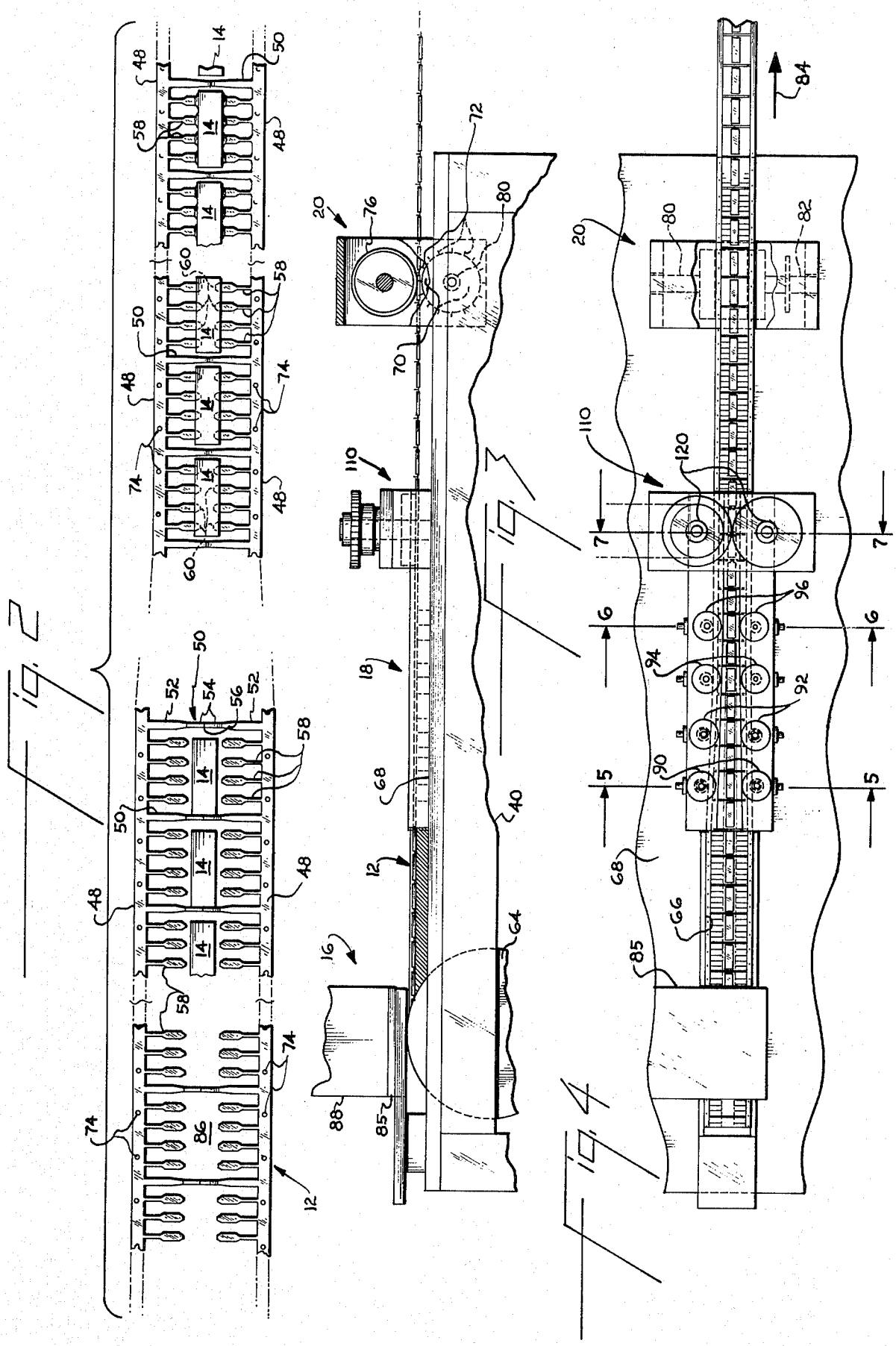

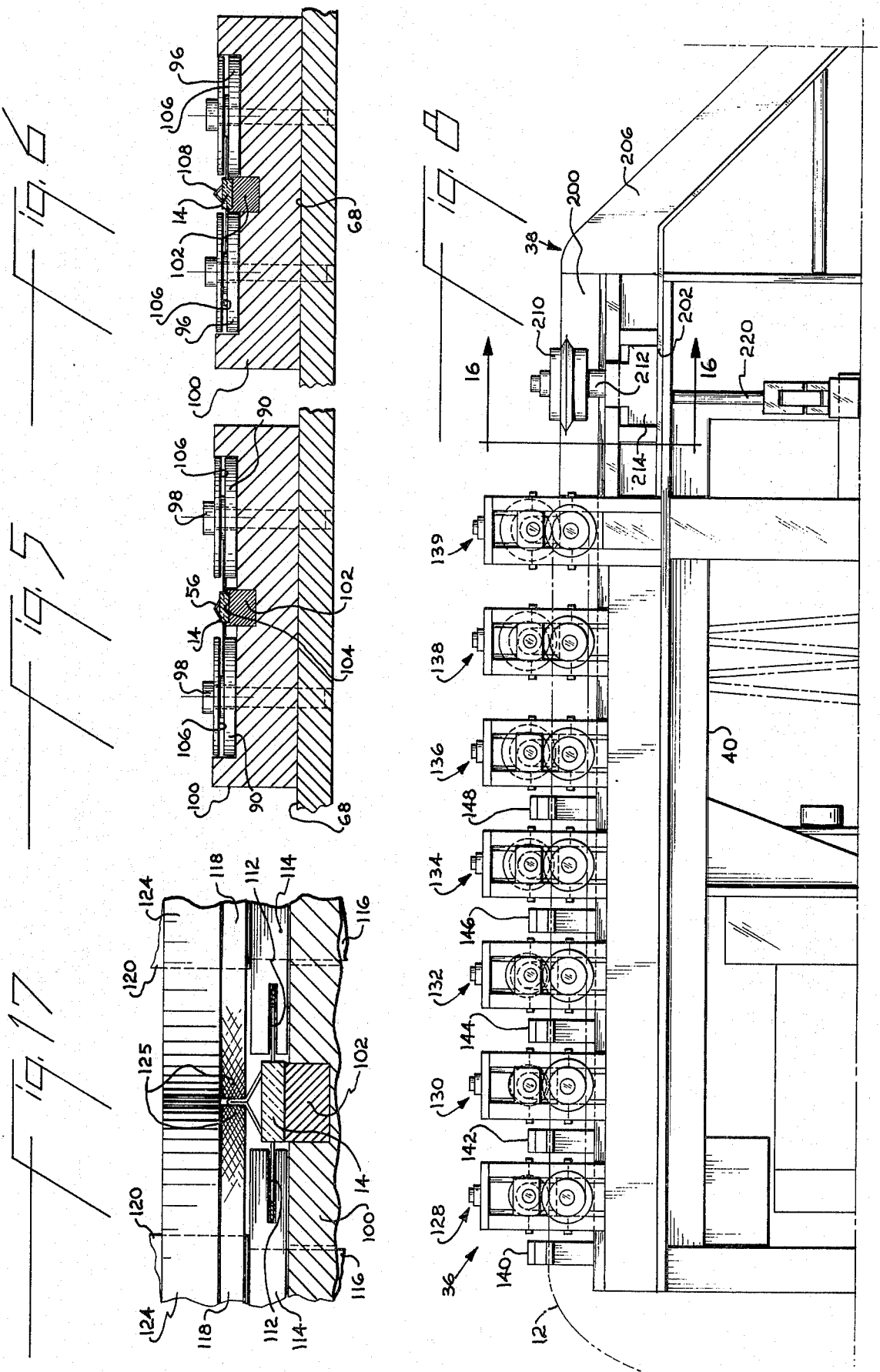

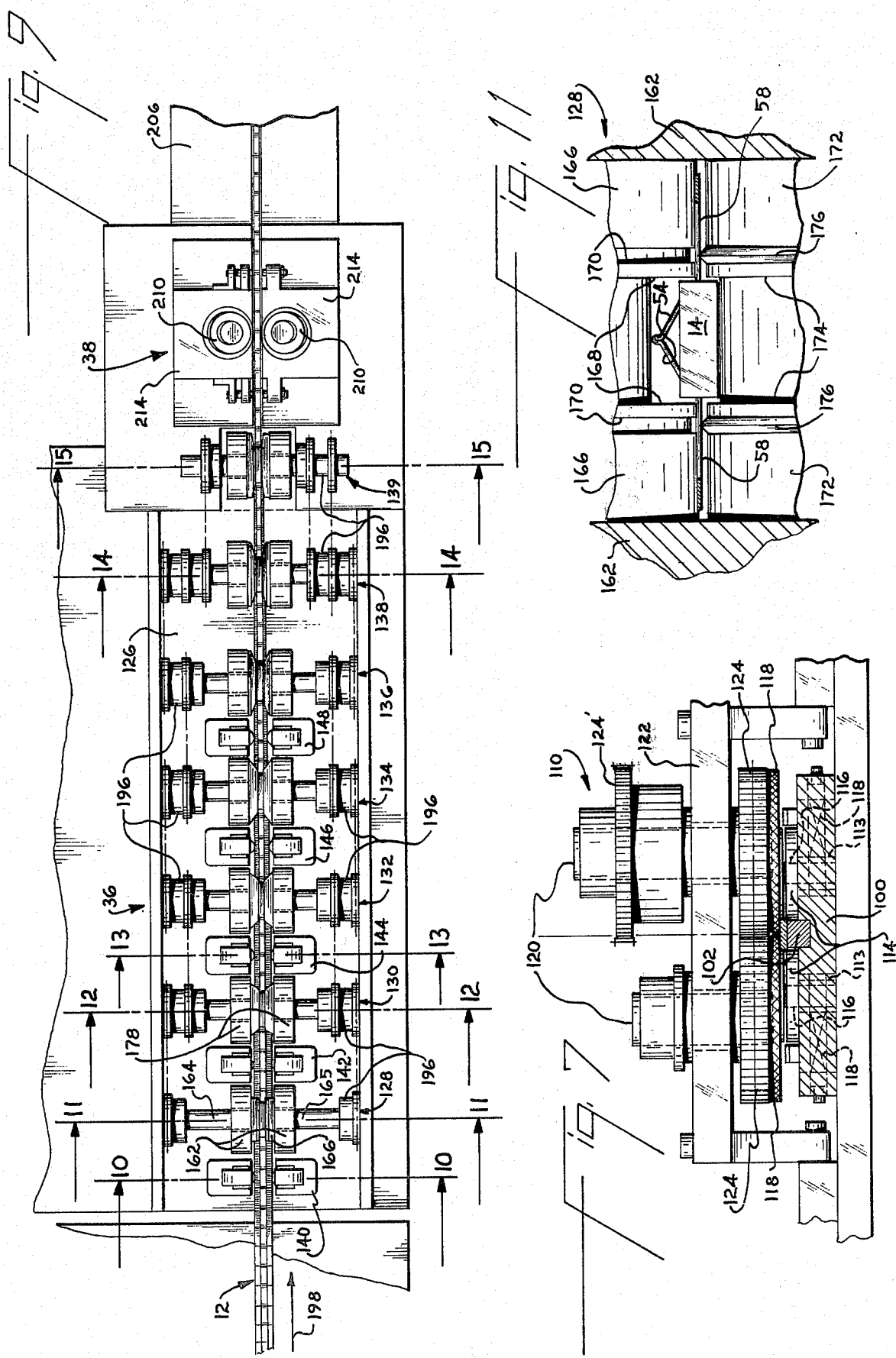

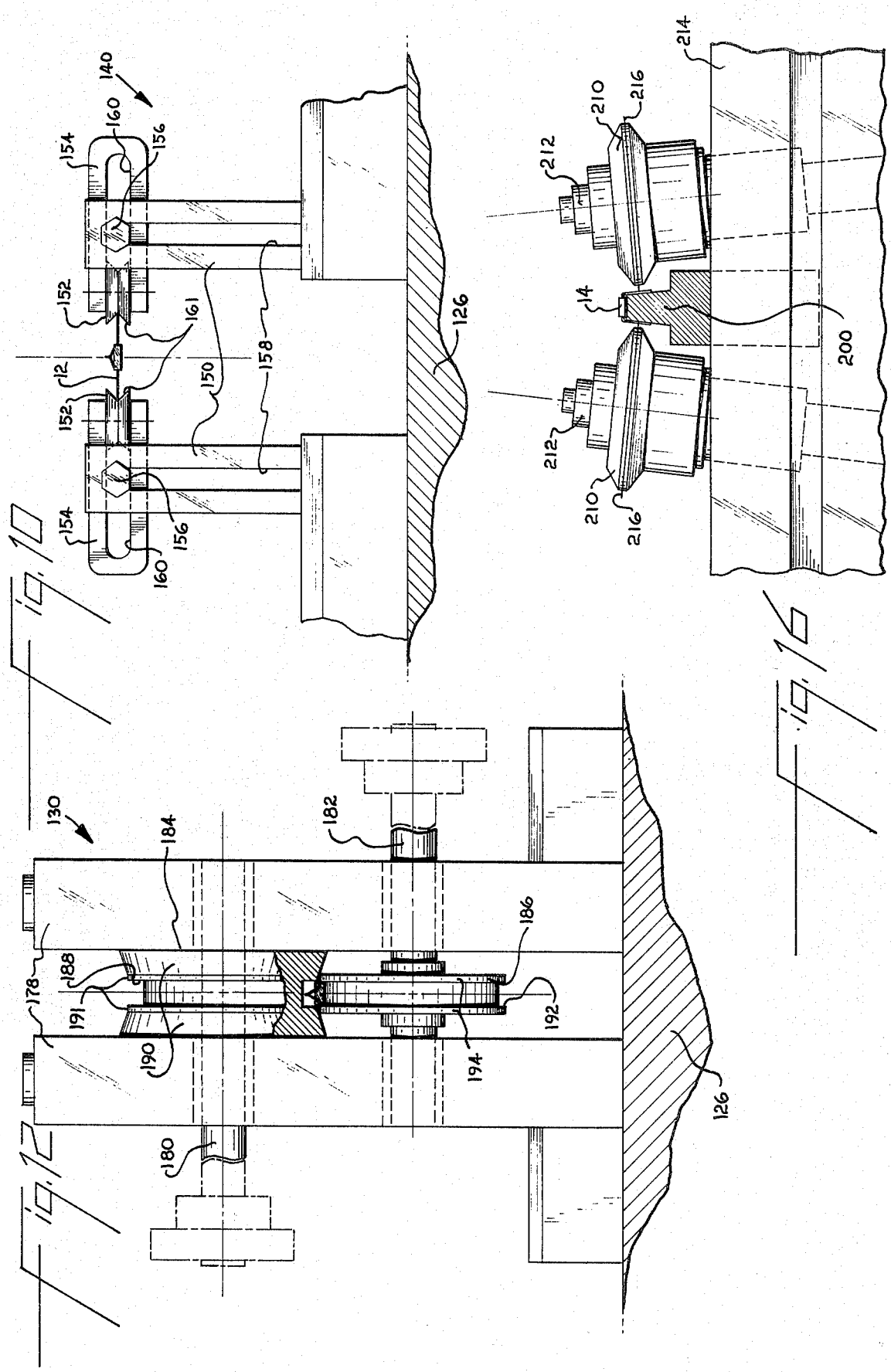

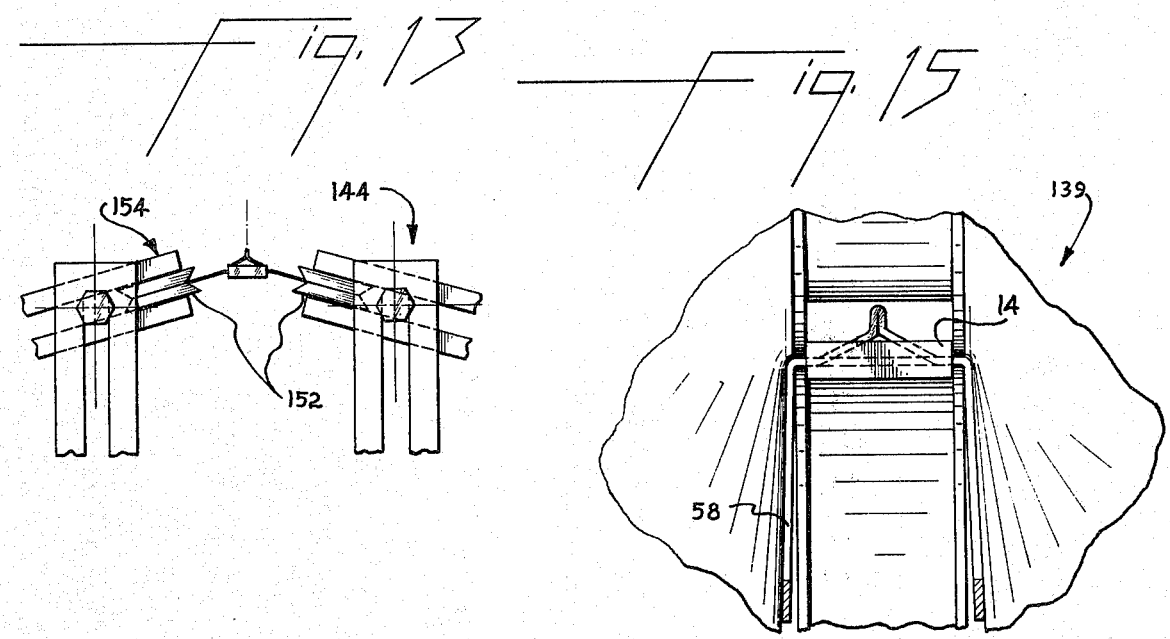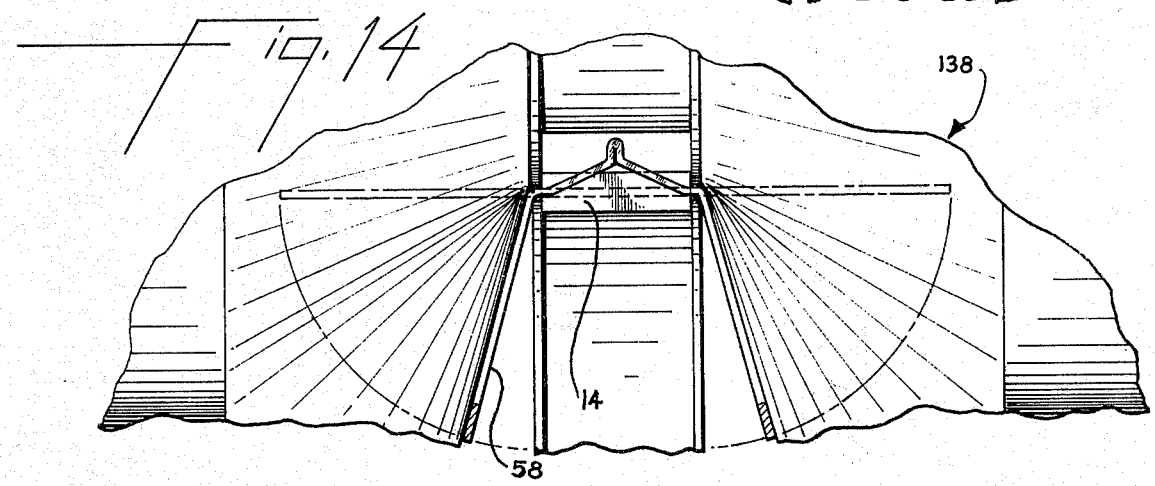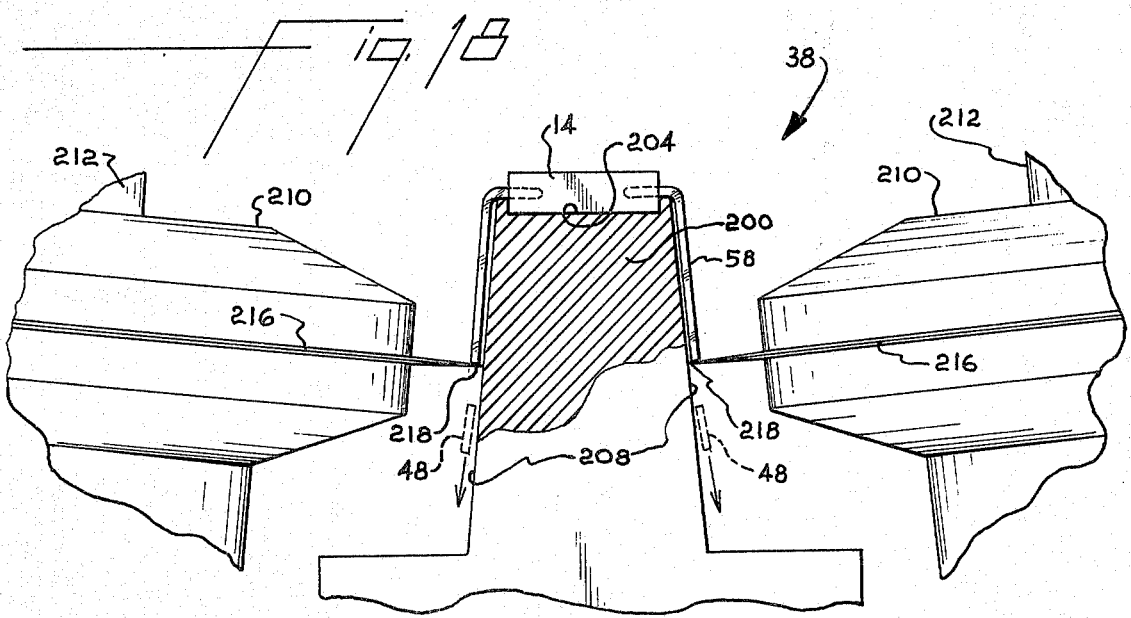

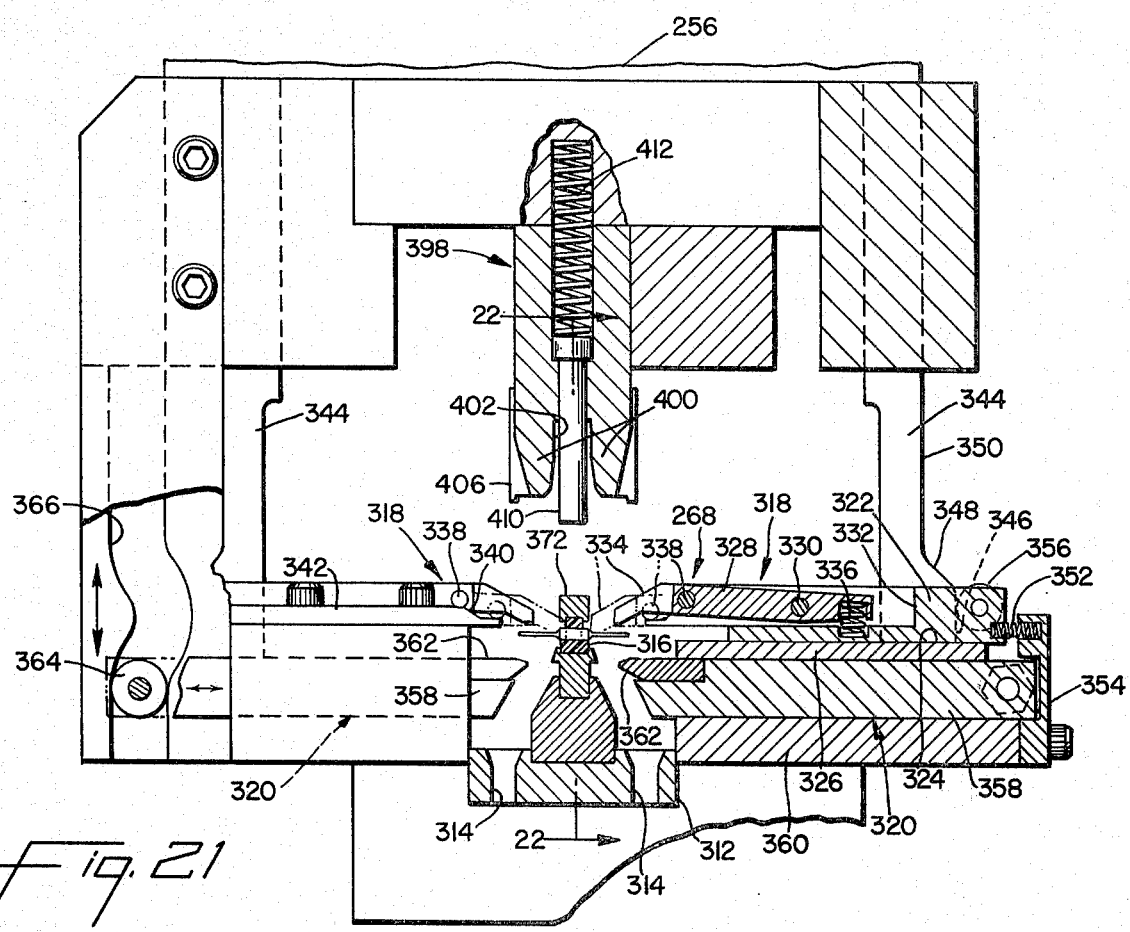
Fig. 21
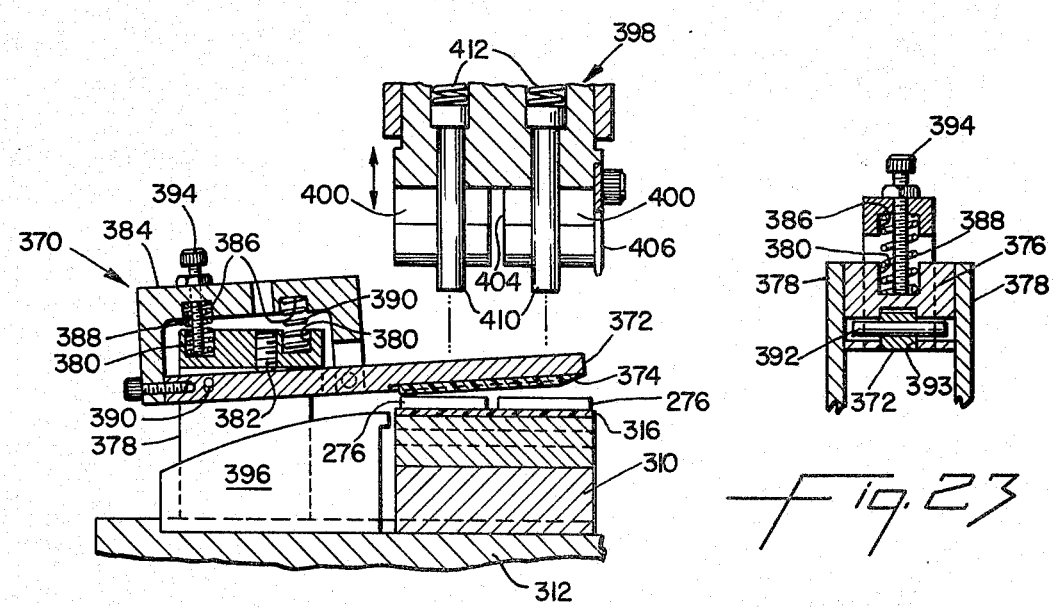
Fig. 22
Fig. 23

APPARATUS FOR MANUFACTURING DUAL IN-LINE PACKAGES

The invention relates to apparatus for continuous manufacture of dual in-line packages having a rectangular body with a series of leads extending outwardly from opposite sides of the body and bent down through an angle of about 90° with respect to the body so that all the leads extend below the body. Conventionally, dual in-line packages have been manufactured by positioning two spaced carrier strips on opposite sides of modules with leads extending from the strips toward the modules. The ends of the leads are held against recesses in the modules and are subsequently soldered to adjacent pads. Following soldering, the leads may be bent down with respect to the module and the carrier strips are removed. Frequently, the leads are manually soldered to the modules.

In the apparatus of the present invention, a continuous lead frame assembly of the type disclosed in my U.S. Patent Application entitled "A Method of Forming A Dual In-Line Package", Ser. No. 506,760, Filed Sept. 17, 1974 is moved past a loading station where leadless modules are positioned within spaces in the lead frame assembly between the ends of leads extending from carrier strips on both sides of the assembly. The assembly is moved downstream from the loading station to a closing station where the carrier strips pass a series of pairs of collapse rollers which force the carrier strips toward each other to move the ends of the leads against the module adjacent to metalized pads on the module. As the carrier strips are moved toward each other, the rungs connecting the strips are collapsed, and following seating of the leads against the modules, the rungs are crimped in the collapsed position to assure that the leads are held in place. The collapsed lead frame assembly and modules are fed through fluxing, heating, soldering, and cleaning stations so that the ends of the leads are reliably soldered to the pads on the modules.

The assembly is next fed through a bending station where the leads extending to either side of the module are bent down to an angle of about 90° so that they extend below the module. In one bending station, the leads are passed through a series of rollers which bend the ends of the leads away from the module down with respect to the module. In another bending station, the leads are bent down upon lowering of forming tooling carried by a press. Following bending of the leads, the carrier strips are cut away from the soldered and bent leads to form individual dual in-line packages.

In the present invention, dual in-line packages are rapidly and reliably mass produced at rates greatly in excess of conventional rates of dual in-line manufacture. Slow, expensive, and potentially unreliable manual operations are eliminated.

Other objects and features of the invention will become apparent as the description proceeds, especially when taken in conjunction with the accompanying drawings illustrating the invention, of which there are 10 sheets.

IN THE DRAWINGS

FIG. 1 is a side elevational view of the apparatus of the present invention;

FIG. 2 is a top view of a lead frame assembly and a number of leadless circuit modules illustrating operations performed by the apparatus of FIG. 1;

FIG. 3 is a side elevational view of a portion of the apparatus of FIG. 1;

FIG. 4 is a view taken along line 4—4 of FIG. 1;

FIGS. 5, 6, and 7 are sectional views taken generally along lines 5—5, 6—6, and 7—7 respectively of FIG. 4;

FIG. 8 is a side elevational view of another portion of the apparatus of FIG. 1;

FIG. 9 is a top view of the portion of the apparatus illustrated in FIG. 8;

FIGS. 10, 11, 12, 13, 14, and 15 are sectional views taken generally along lines 10—10, 11—11, 12—12, 13—13, 14—

Figure 19:
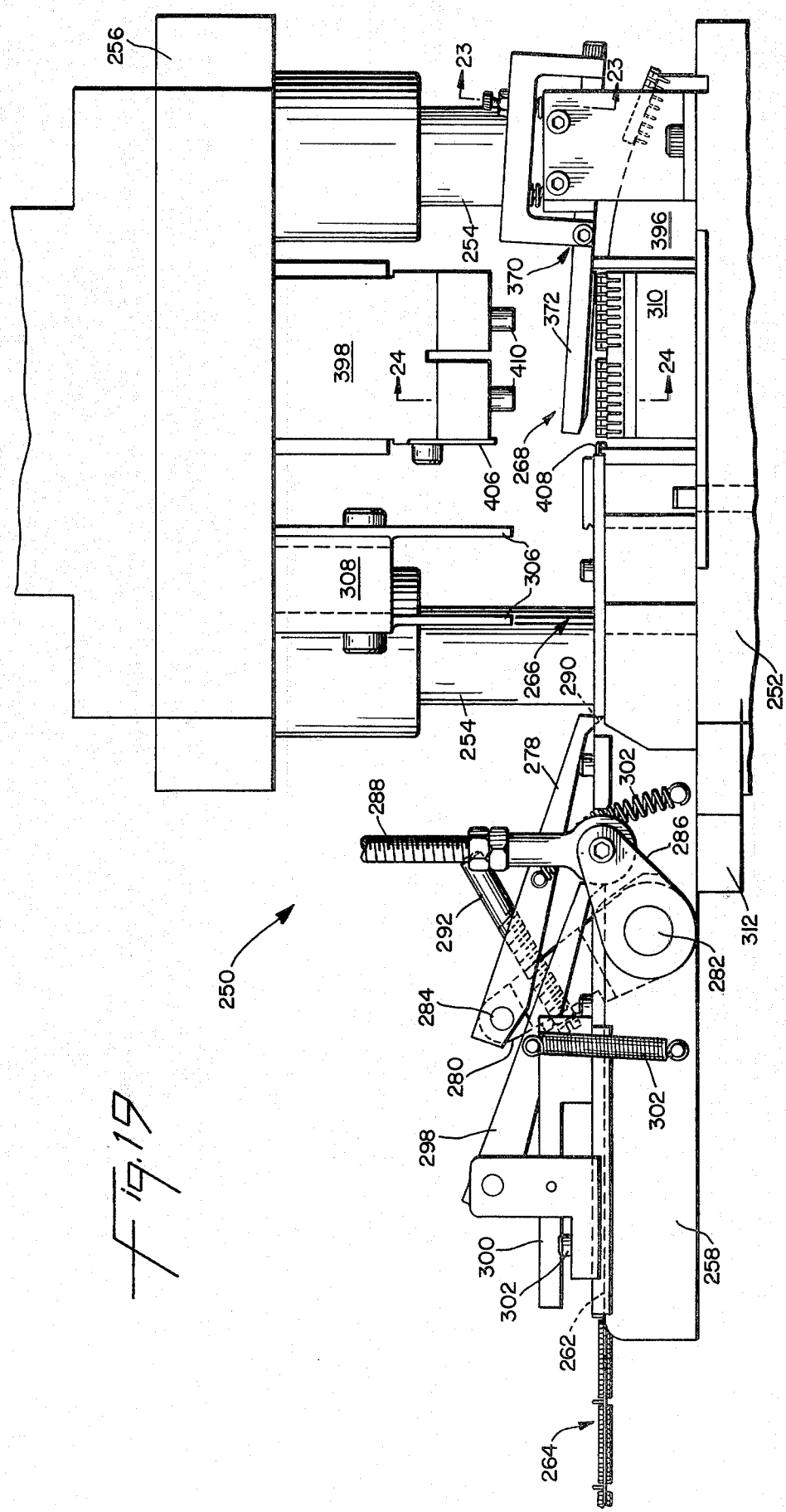
Figure 20:
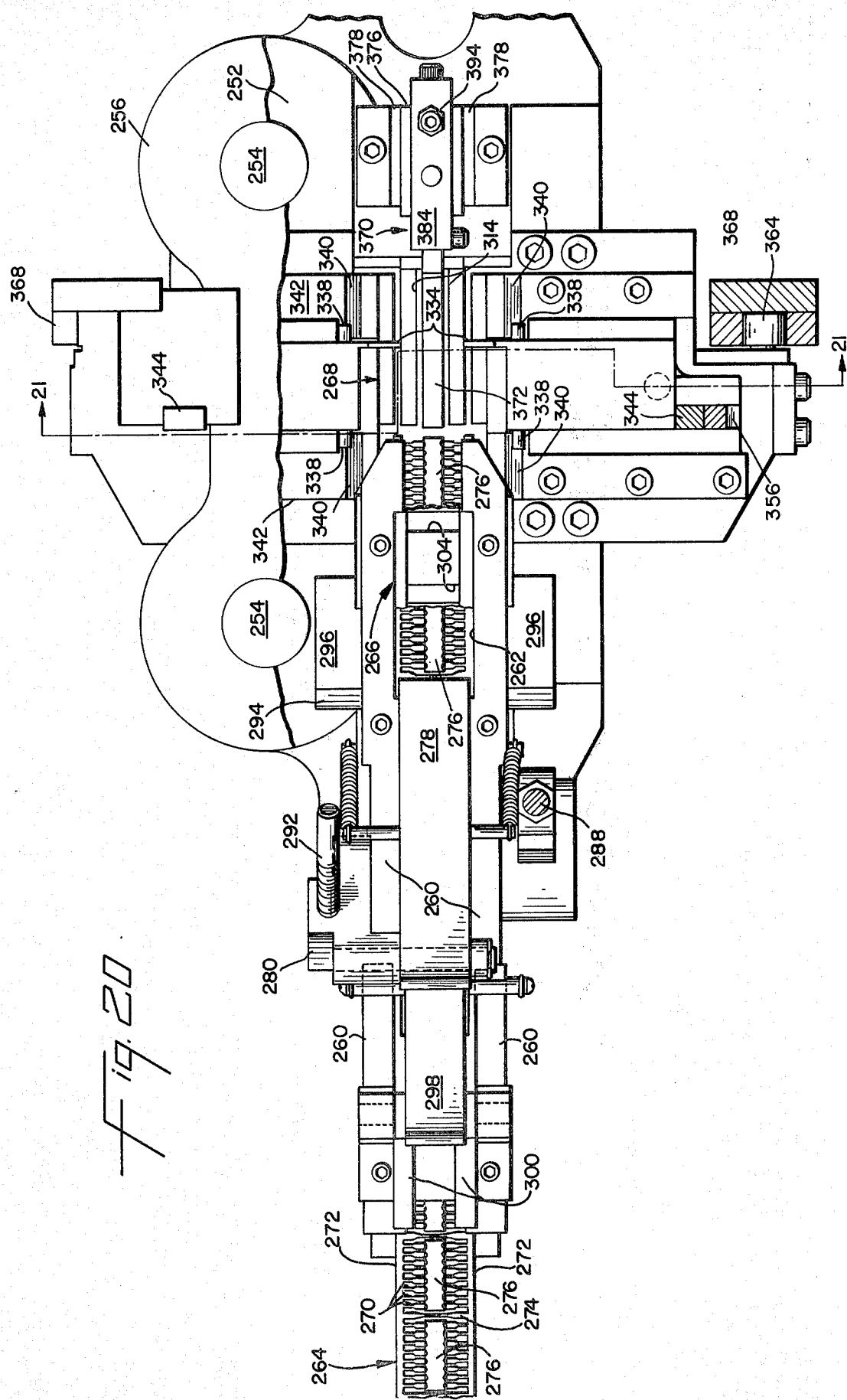
Figures 24, 25, 26, 27:
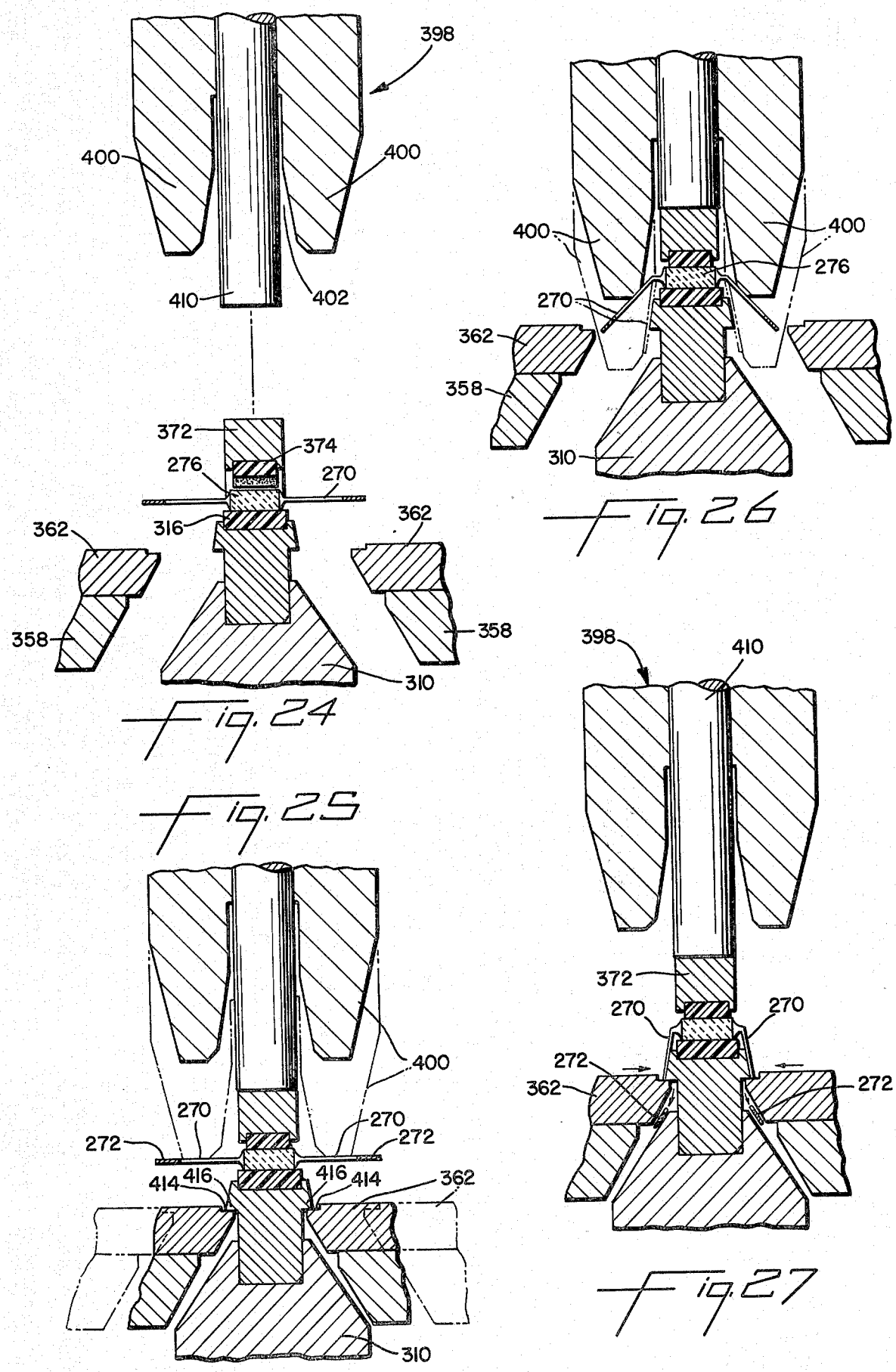

FIG. and 15—15 respectively of FIG. 9;

FIG. 16 is a view taken along lines 16—16 of FIG. 8;

FIG. 17 is an enlarged view of a portion of FIG. 7;

FIG. 18 is an enlarged view of a portion of FIG. 16;

FIG. 19 is a side elevational view partially broken away of another type of bend and cut off unit;

FIG. 20 is a top elevational view of FIG. 19 with the upper tooling broken away;

FIG. 21 is a sectional view taken generally along line 21—21 of FIG. 20;

FIG. 22 is a sectional view taken along line 22—22 of FIG. 21;

FIGS. 23 and 24 are sectional views taken along lines 23—23 and 24—24 respectively of FIG. 19; and FIGS. 25, 26, and 27 are similar to FIG. 24 illustrating the operation of the unit.

Apparatus 10 illustrated in FIGS. 1 through 18 manufactures dual in-line packages from a lead frame assembly 12 as illustrated in FIG. 2 and rectangular leadless circuit modules 14. The assembly and modules are disclosed in my co-pending U.S. Patent Application for "A Method of Forming A Dual In-Line Package", Ser. No. 506,760, filed Sept. 17, 1974. The strip 12 is fed through apparatus 10 from the left to the right as shown in FIG. 1 and is moved along a feed path extending past loading station 16, closing station 18, drive 20, guide 22, fluxing station 24, heating station 26, soldering station 28, guide 30, cleaning station 32, feed 34, bending station 36, and cut off station 38. The stations, guides, and drives are supported on a suitable frame 40 resting on support surface 42. A power drive 44 is located on the frame below the bending station and is connected to various parts of the drives and stations by suitable chain linkages 46.

As illustrated in FIG. 2, lead frame assembly 12 includes a pair of spaced parallel carrier strips 48 joined together at intervals by collapsible rungs 50. Each rung includes a pair of relatively rigid legs 52 extending from a carrier strip 48 and a pair of collapsible links 54 which extend up from the legs 52 to join at a shallow apex 56. A group of leads 58 extend from each carrier strip 48 between adjacent rungs a distance toward the other carrier strip. The free ends of the leads on opposite strips are spaced apart a distance slightly greater than the width of the leadless circuit modules 14. The rungs are spaced apart a distance slightly greater than the length of the modules. Recesses 60 are provided in the sides of module 14 to receive the free ends of leads 58 following collapse of the lead frame assembly 12.

A length of assembly 12 is wound on supply reel 62 removably mounted on frame 40 below the loading and closing stations 16 and 18. The assembly 12 extends from the reel over guide rollers 64 to a feed path 66 extending across support surface 68. The assembly is moved along the feed path 66 by drive 20 which includes a pair of spaced drive wheels 70 carrying feed pins 72 extending upwardly through an opening in the bottom of the feed path 66 to engage spaced pilot holes 74 in the carrier strips 48. Back up rollers 76 are located above the feed path and hold the strips against the wheels 70. Rollers 76 are carried on transverse shaft 78 and drive wheels 70 are carried on transverse shaft 80, both of which are journaled in bearings carried by the frame. Sprocket gear 82, carried by shaft 80, is connected to power drive 44 by a chain linkage 46 such that the power drive rotates the feed 20 to move the lead frame assembly 12 along feed path 66 in the direction of arrow 84.

As the lead frame assembly 12 is moved over the upper guide roller 64, a feed mechanism 85 in loading station 16 automatically positions a loose piece leadless circuit module 14 into each interior space 86 in the assembly defined by the ends of groups of leads and by adjacent rungs. The modules 14 may be individually dispensed from a magazine 88 located to one side of the feed path and pushed to the feed path to fall into each spaces 86. As the assembly 12 moves past the loading station, each rung 50 engages the module 14 in the upstream space 86 and carries the module along the feed path toward the closing station 18. The module 14 may rest in a shallow central groove extending along the feed path.

Drive 20 pulls the lead frame assembly 12 with modules 14 in spaces 86 through the closing station 18 where the spaced carrier strips 48 are moved toward each other to collapse links 54 and move the free ends of leads 58 into their respective recesses 60 in the sides of the modules. As shown in FIGS. 4, 5, and 6, the closing station 18 includes four pairs of like collapsing rollers 90, 92, 94, and 96 which are spaced along the feed path in a direction of travel of the assembly and modules. The rollers are rotatably mounted on pins 98 carried by block 100 mounted on support surface 68. A module guide bar 102 is carried by base 100 and includes a shallow recess 104 extending along the closing station between the roller pairs. As the lead frame assembly is moved through the closing station, the modules 14 slide along the recess 104. The lead-receiving recesses in the modules are located at a level above the side walls of the recess 104.

A deep groove 106 extends around the circumference of each collapse roller 90. The other pairs of collapse rollers, 92, 94, and 96 are also provided with like circumferential grooves 106. The spacing between the bottoms of the grooves of the pairs of rollers decreases in the direction of travel of the lead frame assembly. The flat spaced carrier strips 48 of the assembly 12 are fed through the grooves 106 of the collapse rollers so that as the assembly is pulled through the closing station 18 by drive 20, the carrier strips are forced toward each other, collapsing the links 54 and moving the ends of leads 58 toward each other and into their respective lead-receiving recesses 60 in the sides of the modules 14. As the leads are moved toward the recesses 60, they engage the downstream edges thereof and center the modules within spaces 86 so that the modules are moved downstream with respect to the lead frame assembly and away from the upstream rungs 50. The collapse rollers 96 complete inward movement of the carrier strip so that the leads are seated in the recesses. In this position, as illustrated in FIG. 6, the straight collapsible links 54 are bent up to a relatively sharp apex 108.

The collapsed lead frame assembly is moved downstream from rollers 96 to crimp unit 110 illustrated in FIGS. 7 and 17 where the carrier strips 48 are lead into and seated against the bottoms of slots 112 in rollers 114 mounted on pins 116 which are mounted on support members 113. The members 113 are biased toward the bar 102 by springs 118 which force the rollers 114 toward the substrate to assure that the ends of the leads 58 are snugly seated in the recesses 60. The depth of the slots 112 is less than the distance from the sides of the substrate to the outer edges of the carrier strips to prevent bottoming of the rollers against the sides of the modules.

A pair of crimping rollers 119 are carried by shafts 120 journaled in bearings on support plate 122 located above the base 100. Gears 124 on shafts 120 are meshed so that rollers 118 rotate together. One shaft 120 carries sprocket gear 124' which is connected to the power drive 44 through a chain linkage 46 so that the drive rotates both of the crimp rollers 119 to move the circumference of the rollers downstream above the feed path. A knurled circumferential surface 125 is provided on each roller 119 so that the minimum spacing between the knurled surfaces on the center line of the feed path is equal to approximately twice the thickness of the collapsible links 54. Downstream movement of the collapsed lead frame assembly moves the carrier strips through the clamp rollers 114 and brings the sharp apexes 108 of successive collapsed rungs 50 to and through the crimp rollers 119. As the rungs are moved to the crimp rollers, the clamp rollers 114 assure that the leads 58 are snugly seated in the recesses in the modules 14. Movement of the sharp apexes 108 pass the knurled surfaces 125 crimps the tips of the links together as illustrated in FIG. 17, thereby securing the ends of the leads in the recesses in position to be soldered.

Because the width of the individual modules 14 may vary and because the distance between the ends of the leads 58 in the assembly 12 and the outer edges of the carrier strips 48 may also vary, the distance between the bottoms of the grooves 106 in rollers 96 is adjusted to assure that the ends of the leads are seated firmly in the recesses in the modules only in the event that a given module has a maximum width and the distance between the ends of the leads and the carrier strips is also at a maximum. In the event that manufacturing tolerances of the modules and carrier strips are less than maximum, the rollers 96 will move the ends of the leads an appreciable distance into the recesses but will not bottom the leads into the recesses. As the lead frame assembly 12 and the modules are moved through the crimp unit 110 the spring biased rollers 114 positively seat the ends of the leads in their respective recesses, without regard to the actual width of the distance between the ends of the leads and the carrier strips. With the leads thus seated in the recesses, the tips of the flat links 54 are crimped against each other to hold the carrier strips against separation and assure that the leads are positively seated in the recesses during the soldering operation.

Following collapse of the lead frame assembly and crimping of the rungs, the assembly 12 is lead through drive 20, over guide 22, and through fluxing station 24, heating station 26, and soldering station 28 to guide 30. As the assembly moves through the fluxing station 24 flux is applied to the leads and to the metalized surfaces on the edges of the module adjacent the recesses. At the heating station the assembly is preheated and at the soldering station the leads and modules are passed through a wave of molten solder to form soldered connections between the ends of the leads and the metalized surfaces on the modules. These surfaces extend to circuit elements carried by or in the modules. From guide 30, the soldered assembly is lead through cleaner station 32 where excess flux and impurities are removed. From the cleaning station the assembly is lead to a drive 34 which is actuated by power drive 44 through a suitable chain linkage. From drive 34 the assembly is lead through bending station 36 and cut off station 38. Stations 24, 26, 28, and 32 are conventional in design.

Bending station 36, as illustrated in FIGS. 8 through 15, includes a support plate 126 on frame 40 with score unit 128 and a number of lead bending units 130, 132, 134, 136, 138, and 139 mounted on the plate at spaced downstream intervals along the feed path of the assembly 12. Orienting guides 140, 142, 144, 146, and 148 are located immediately upstream of units 128, 130, 132, 134, and 136. Each guide engages the edges of the lead frame assembly as it moves downstream to aid in centering the same with respect to the downstream unit. Score unit 128 scores the undersurface of each lead 58 and of the rigid legs 52 of the rungs a slight distance outwardly from the edge of the module to facilitate bending of the leads and rungs by the bending units. The bending units progressively bend the leads and rungs downwardly at the score locations so that after the assembly leaves the downstream bending station 139, the leads and rungs are bent down through an angle somewhat less than 90° to the desired dual in-line configuration.

Guide 140 is illustrated in FIG. 10 and includes a pair of supports 150 mounted on plate 126. Alignment rollers 152 are rotatably mounted on pins carried by holders 154. The holders are secured to the supports by bolts 156 extending through vertical slots 158 in the supports 150 and adjustment slots 160 in the holders. V-shaped alignment grooves 161 are formed in the circumferences of rollers 152 to receive the edges of the lead frame assembly as it moves through the guide. The rollers of guide 140 are oriented horizontally and face the flat lead frame assembly so that the outer edges of the carrier strips 48 are seated in the bottoms of the grooves 161. The pins carrying rollers 152 are spring-mounted in holders 154 so that the normal spacing between the bottoms of the grooves 150 is slightly less than the normal spacing between the outer edges of the carrier strips 48, assuring that the rollers press inwardly against the strip to assure that the strip is properly aligned as it enters the scoring unit 128 despite manufacturing tolerances which may result in variations in width of the assembly.

Scoring unit 128 is illustrated in FIGS. 9 and 11 and includes a pair of support blocks 162 mounted on plate 126 to either side of the feed path immediately downstream of guide 140. Upper shaft 164 extends through blocks 162 above the feed path and a lower shaft 165 extends through the blocks beneath the feed path immediately below shaft 164. The shafts are rotatably mounted in the blocks. Shaft 164 carries a back up roller 166 located between blocks 162. The roller includes a circumferential module-receiving recess 168 and a pair of narrow circumferential score recesses 170 located to either side of recess 168. As illustrated in FIG. 11, the roller is positioned immediately above the feed path so that as the lead frame assembly is moved downstream, the upper half of the modules 14 extend into recess 168. A score roller 172 is mounted on the shaft 165 below shaft 164 and includes a circumferential module-receiving recess 174 located beneath recess 168 and a pair of sharp-edged circumferential score ridges 176 located to either side of recess 174 beneath the recesses 170 in roller 166. The rollers 166 and 172 are spaced apart a distance such that the edges of ridges 176 score the undersurfaces of leads 58 and rungs 50 as the assembly 12 is moved through the score unit 128. Shaft 164 carrying roller 166 extends to one side of blocks 162 and shaft 165 carrying roller 172 extends to the other side of blocks 162.

Guide 142 located between score unit 128 and the first lead bending unit 130 is identical to guide 140 and holds the flat lead frame assembly as shown in FIG. 10. The first bending unit 130 includes a pair of blocks 178 mounted on plate 126 with a pair of shafts 180 and 182 extending through bearings in the blocks. The upper shaft 180 extends to the same side of the feed path as shaft 164 in score unit 128 and lower shaft 182 extends to the other side of the feed path. Bending roller 184 is carried by shaft 180 between blocks 178 and back up roller 186 is carried on shaft 182 beneath roller 184. The bending roller 184 includes a central circumferential module recess 188 and a pair of beveled or frustro-conical bending surfaces 190 located to either side of the module recess 188. Surfaces 190 lie on the surface of a 15° cone, that is a cone generated by rotation of a line intersecting the axis of shaft 180 at an angle of 15°. A pair of cylindrical support ridges 191 are located beneath the recess 188 and surfaces 190.

The support roller 186 includes a central module-receiving recess 192 and a pair of cylindrical support ridges 194 to either side of the recess. As illustrated in FIG. 12, the recesses 188 and 192 are positioned one opposite the other and the ridges 191 are opposite ridges 194. Ridges 191 and 194 are spaced apart a distance equal to the thickness of the lead frame assembly 12.

Bending units 132, 134, 136, and 139 are similar to unit 130 and each includes a bending roller and a support roller between which the assembly and modules are fed. The support rollers of these units are identical to roller 186 while the bending rollers are provided with fustro-conical or beveled bending surfaces lying on the surfaces of cones intersecting the axes of their supporting shafts at progressively steeper angles. For instance, the bending surfaces of unit 132 lie on the surfaces of 30° cones, those of unit 134 lie on the surfaces of 45° cones, those of unit 136 lie on the surfaces of 60° cones, those of unit 138 lie on the surfaces of 75° cones and those of unit 139 are nearly vertical, lying on the surfaces of nearly 90° cones. All of the bending units include ridges like ridges 191 and 194. See FIGS. 12, 14, and 15.

The shafts carrying the bending rollers of all of the bending units extend to one side of the feed path while the shafts carrying the support rollers extend to the other side of the feed path. As illustrated in FIG. 9, sprocket gears 196 are mounted on the ends of shafts 164 and 165 of the score unit 128 and on the ends of the shafts carrying the bending and support rollers of the lead bending units, 130, 132, 134, 136, 138, and 139. Suitable chains connect the gears on each side of the bending station together and are connected to the chain linkage 46 extending from power drive 44 so that the drive rotates all of the shafts so that the portions of the respective rollers adjacent the feed path move downstream at the same speed.

Guides 144, 146, and 148 are like guide 140 with the exception that the holders 154 are positioned at an appropriate angle to hold the edges of the lead frame assembly in alignment grooves 161 with the carrier strips and leads extending outwardly from the grooves directly away from the roller. Thus, the rollers of guide 144 illustrated in FIG. 13 are each positioned to an angle of 15° below horizontal to hold the carrier strips of assembly 12 which are bent down 15° by lead bending unit 130. Rollers of guides 146 and 148 are positioned down from the horizontal at angles of 30° and 45° respectively in order to seat the edges of the successively bent down lead assembly in the alignment grooves 161. The adjustment of the guides so that the rollers and holders are at the appropriate location is easily accommodated by loosening bolts 156 and moving the holders and bolts along slots 158 and 160. As the rollers are positioned at angles further from horizontal, they are located slightly nearer each other and below the position of the rollers of unit 140. See FIG. 13. Guides are not provided for bending units 138 and 139.

The flat soldered lead frame assembly 12 is fed through the lead bending unit 139 in the direction of arrow 198 shown in FIG. 9 by frictional engagement between the various upper and lower rollers of the score unit and lead bending units. The flat assembly is fed first through guide 140 and then past score unit 128 so that score marks are formed on the under surfaces of the leads and rungs where these elements are subsequently bent downwardly by the lead bending units. Upon exiting the scoring unit, the assembly moves past guide 142 and into the first bending unit 130. As the assembly moves through this unit, the rungs and leads adjacent the sides of the modules are held together between the support ridges 194 and 191 while the laterally extending portions of the leads and rungs are bent downwardly 15° by bending surfaces 190.

The partially bent assembly then passes through guide 144 and bending unit 132 where the leads and rungs adjacent the sides of the module are again held between support ridges of the two rollers in the unit and the partially downwardly bent leads and rungs are bent downwardly to a further 15°. Continued movement of the assembly carries it through guide 146, bending unit 134, guide 148 and bending units 136, 138, and 139 so that the carrier strips, and outer portions of the leads and rungs, are bent down through nearly 90° from their initial horizontal position. Because the ends of the leads adjacent to soldered connections with the sides of the modules are clamped as the exposed lead portions were bent down, the bending operations do not subject the soldered lead-substrate connections to stresses tending to injure these relatively delicate connections.

Cut off station 38 illustrated in FIGS. 8, 9, 16, and 18 includes an elongate module guide bar 200 mounted on support plate 202 on frame 40 and having a module-receiving recess 204 extending along the length of the bar from a location immediately downstream of the end lead bending unit 139 to discharge ramp 206 at the downstream end of the apparatus 10. As illustrated in FIG. 18, the flat side walls 208 of the guide bar 200 diverge below recess 204 at a shallow angle so that they parallel the bent down leads of the assembly 12 which move along the bar. A pair of rotary lead cutters 210 are secured on the ends of shafts 212 journaled in bearings in blocks 214 on plate 202. The cutters 210 are located on either side of the guide bar 200 and each includes a sharp circular rotary knife 216 having a sharp cutting edge 218 which, with rotation of the cutters 210, sweeps past and nearly touches the adjacent surface 208 of the guide bar. The axes of shafts 212 are parallel to the sides 208 so that the knives 216 are perpendicular to the side walls. Each shaft 212 is connected to a drive shaft 220, a sprocket gear and a chain of linkage 46 so that the cutters 210 are driven by the power drive 44 to rotate the knives in the direction of movement of the assembly 12 along the guide bar 200 from the bending station to the discharge ramp 206.

The module-receiving recess 204 in the guide bar 22 is located at a level to receive the modules 14 of the assembly as the assembly is fed downstream of the final bending unit 139. The downstream bent leads 58 parallel and are closely spaced to the side walls 208. The assembly is fed along the guide bar by the upstream bending units which engage the leads and move them, together with the attached carrier strips 48 and modules 14 downstream to push the portion of the assembly below the final lead bending unit 139 and along bar 200. As the leads in the assembly pass the downstream rotating cutters 210, the edges 218 sever the leads 58 from the carrier strips 48 immediately above the inner edges of the carrier strips. See FIG. 18. The severed carrier strips are led away from the cut off station as desired and the loose piece rungs 50 fall away. Freed DIP packages with downwardly bent leads or legs 58 are pushed along the bar 200 by upstream modules so that they fall down discharge ramp 206. They may be collected in a magazine, loose part container, or may be conveyed away for a subsequent manufacturing operation, as desired.

FIGS. 19 through 27 illustrate a bend and cut off station 250 which may be used in apparatus 10 in place of the bending and cut off stations 36 and 38. Station 250 includes a conventional punch press (not illustrated) having a fixed lower press plate 252, a pair of guide posts 254 extending upwardly from plate 252 and an upper press plate 256 mounted on the guide post and attached to the ram of the press so that during each revolution of the press the upper press plate and tooling carried thereby are lowered from the rest position as illustrated in FIGS. 19 and 21 and are then raised back to the rest position. The station 250 includes a base 258 mounted on plate 252 within a number of cover plates 260 secured to the top of the base to define a feed path 262 for lead frame assembly 264 extending from the left of the station 250 as shown in FIGS. 19 and 20 to a first work station 266. A second work station 268 is located downstream or to the right of station 266. Lead frame assembly 264 runs to station 250 from the previously described stations of apparatus 10. The assembly 264 illustrated is identical to assembly 12 with the exception that a greater number of leads 270 extend from each of the carrier strips 272 between adjacent collapsed rungs 274. The ends of the leads are soldered to metalized pads on leadless circuit modules 276 located between adjacent rungs 274. At work station 266, the collapsed rungs are blanked from the assembly and at work station 268 the carrier strips are severed from the assembly 264, the leads are bent down with respect to the modules through nearly 90° and the carrier strips are then cut away from the leads.

The bend and cut off station 250 is mounted on frame 40 downstream of drive 34 in place of the bending station 36 and cut off station 38. A sufficient length of the lead frame assembly moving through apparatus 10 is provided between drive 34 and the station 250 to hang down between the drive and the station to form the loop of the type illustrated on FIG. 1 between the drive and the bending station 36.

The lead frame assembly 264 is fed through station 250 by conventional feed finger 278. Arm 280 is secured to one end of shaft 282 extending through the width of base 258. The other end of the arm 280 carries a pin 284 extending through one end of the feed finger. Crank arm 286 is mounted on the other end of shaft 282 and is attached at its free end to a feed actuation rod 288 which extends upwardly to a follower engaging a cam on the crank of the press so that during each rotation of the crank the feed finger is moved downstream with respect to the feed path 262 from the position of FIG. 19 and then upstream along the path to move the assembly 264 toward the first work station 266. The feed finger includes a pair of pawls 290 which engage the upstream edges of the collapsed rungs 274 to feed the assembly downstream. During each work stroke, the finger moves two substrates 276 to the first work station 266 and moves the two substrates formerly at that station downstream to the second work station 268. The arm 280 carries an adjustable stop bolt 292 which, when the feed finger is extended, engages a stop surface 294 on one of a pair of blocks 296 located to either side of the first work station to permit adjustment of the work stroke.

Station 250 includes a conventional latch 298 which prevents upstream movement of the lead frame assembly as the feed finger is moved upstream and a pair of conventional drags 300 which engage the two carrier strips 272. Suitable springs 302 bias the feed finger, latch and drags against the assembly 264 in the feed path.

A pair of blanking slots 304 are provided in the bottom of the feed path 262 at work station 266 below the position of the collapsed rungs 274 located upstream of the two modules 276 at the work station. Punches 306 mounted on block 308 carried by the upper press plate 256 are located immediately above the slots 304. The punches extend across the width of the feed track a distance equal to the interior spacing between the carrier strips 272 so that when the upper press plate is lowered and the punches are moved to and below the feed path they engage the collapsed rungs and blank the rungs from the carrier strips. The blanked rungs fall away through slots 304. During the blanking operation, the assembly is supported by the lower surface of the feed path at the work station so that the solder joints between the leads and the pads on the modules are not stressed.

As illustrated in FIG. 21, module support 310 at work station 268 is mounted on insert plate 312 which, in turn, is secured to the lower press plate 252. Scrap slots 314 extend through plate 312 to either side of the support to permit severed lengths of carrier strips 272 to fall away from the work station. A resilient clamping strip 316 is secured to the top surface of the support 310 and extends along the support a distance sufficient to receive a pair of modules 276 as illustrated in FIG. 22.

Station 250 includes a pair of like module locators 318 each positioned on one side of support 310 and a pair of like strip cut offs 320 also located on opposite sides of the support 310. Each locator 318 includes a slide 322 mounted in a recess 324 on fixed plate 326 for movement toward and away from the support 310. A locating finger 328 is rotatably mounted on pin 330 extending between the side walls of slot 332 formed in the slide. Finger 328 includes a narrow locating tip 334 at the end thereof adjacent the support 310. A spring 336 is confined between the bottom of the slot 332 and the end of the finger 328 away from support 310 to bias tip 334 down toward the support. A pair of cam pins 338 extend outwardly from the sides of the finger and are held against the cam surfaces 340 of covers 342 by spring 336.

A pair of like cams 344 are secured to and extend down from the upper press plate 256. The surface of each cam facing away from support 310 includes dwell, rise and dwell surfaces 346, 348, and 350. A spring 352 confined between fixed end plate 354 and slide 322 biases the slide toward the support 310 to hold roller 356 carried by the slide against the surfaces of cam 344 as illustrated in FIG. 21.

Each strip cut off 320 includes a slide 358 confined in the recess between fixed plates 326 and 360 and moveable toward and away from the support 310. A cutter 362 is mounted on the end of the slide 358 adjacent support 310 and extends along the length of the support. Cam roller 364 is secured to the slide and is fitted within cam slot 366 in cam 368 mounted on and extending down from the upper press plate 256 adjacent cam 344.

A substrate clamp unit 370 is mounted on plate 312 downstream of the support 310 and includes a clamp bar 372 extending over the top of support 310 with a resilient strip 374 secured to the lower surface of the bar and overlying strip 316 on the support. A block 376, illustrated in FIGS. 22 and 23, is secured on the upper ends of brackets 378 mounted on plate 312. The block includes a pair of spring bores 380 formed in the upper surface thereof and carries a pivot set screw 382 which projects below the lower surface of the block. The clamp bar pivots about the end of the set screw. A U-shaped bracket 384 is secured to the end of the clamp bar away from support 310 and surrounds the block 376. Spring bores 386 are formed in the bracket opposite bores 380. Spring 388 and 390 are seated in the pairs of bores 380, 386 with spring 390 located adjacent support 310. Pin 392 extends through clamp bar 372 and into enlarged openings in block 376 to either side of bar-receiving slot 393.

The springs 388 and 390 normally bias the clamp bar upwardly away from the support 310, pivoting the bar about pin 392 so that it engages the set screw 382 as shown in FIG. 22. In this position, the resilient strip 374 is held sufficiently above strip 316 on support 310 to permit feeding of two modules 276 from station 266 to their position at station 268 between the resilient pads. Set screw 394 extends from bracket 384 into the spring bore 380 adjacent pin 392.

Discharge ramp 396 is located downstream of support 310. Completed dual in-line packages are pushed from station 268 onto the ramp and slide down the ramp for collection, as desired.

A forming die 398 is mounted on upper press plate 256 above support 310 and includes a pair of spaced arms 400. When the press is lowered the arms straddle the support so that the support extends into the recess 402 defined by the arms. Slots 404 are provided in arms 400 above tips 334 to permit lowering of the die over the extended locating fingers 328. Cutter 406 is secured to the upstream side of the forming die 398 and cooperates with cutting shoulder 408 on the end of the feed path adjacent the support 310 to sever the carrier strips secured to the two lead modules at work station 368 from the remainder of the lead frame assembly. See FIG. 19.

A pair of spring-backed pins 410 are carried in bores in the forming die 398 with springs 412 biasing the pins outwardly of the bore so that the lower ends of the pins extend below the lower ends of the die arms 400 and, upon lowering of the upper press plate, engage the clamp bar 372 and hold it against the modules 276 on the support 310 to clamp the same in position during bending of the leads secured to the modules and cut off of the carrier strips.

The operation of the bend and cut off station 250 will now be described in detail. The punch press which raises and lowers the upper press plate 256 is actuated by means of a sensor (not illustrated) which starts the press when a sufficient length of lead frame assembly 264 is available in the loop between the drive 34 and station 250. Upon actuation of the punch press, the feed finger 278 is extended from the position of FIG. 19 and then retracted to feed two modules in the assembly to work station 266 and to feed the two modules of the assembly previously at station 266 to station 268 where the modules rest on the resilient strip 316 on support 310 beneath the elevated clamp bar 372. See FIG. 22. The completed dual in-line packages at station 268 are pushed onto and fall down ramp 396.

Following extension and retraction of the feed finger, the press lowers the upper press plate so that punches 306 blank away the collapsed rungs 274 upstream of the two modules at work station 266. The rungs fall away through slots 304. This is the only operation performed at station 266. At station 268, lowering and raising of the press severs the carrier strips 272 secured to the two modules on support 310 from the remainder of the lead frame assembly, bends down the leads of these modules and then severs the carrier strips from the bent down leads.

In describing the operations at work station 268, attention is directed to FIGS. 21 and 24 through 27. FIG. 24 illustrates the work station 268 before the upper press plate is lowered. As the press lowers rollers 356 on the locator slides 322 fall down rise surfaces 348 on cams 344 permitting springs 352 to move the slides 322 toward the support 310. As the slides move toward the support pins 338 fall down cam surfaces 340 with the result that the thin locating tips 334 are moved in and down toward the downstream end of the upstream substrate on support 310. When rollers 356 rest on cam surfaces 350 the tips are fully extended and engage the end of the substrate to center the lead frame assembly with respect to the support 310. During centering, the entire lead frame assembly may be pivoted slightly as the tips are moved to their extended positions. The tips are maintained in their extended positions with rollers 356 engaging surfaces 350 until the upper press plate has bottomed and is raised back nearly to the start position.

After the lead frame assembly has been centered so that the two modules at station 268 are accurately positioned on support 310, further lowering of the upper press plate brings the spring-backed pins 410 into engagement with the top of the clamp bar 372 to lower the clamp bar flush onto the tops of the modules 376 and clamp them in place between the two resilient strips 316 and 374. With the modules clamped in place, further lowering of the press brings cutter 406 down against the carrier strips 272 at shoulder 408 to sever the same and remove the modules at the work station 268 from the lead frame assembly.

When the upper press plate begins its descent the cutters 362 of strip cut offs 320 are located in the retracted positions as illustrated in FIG. 24. After the press is lowered sufficiently to bring pins 410 down against clamp bar 372 and clamp the substrates on the support, the cam rollers 364 are moved inwardly to the crest of cam slot 366 and cutters 362 are moved in toward support 310 with cutting edges 414 extended under cutting shoulders 416 on the support. See the full lined position of FIG. 25. Further lowering of the press brings the ends of die arms 400 down against the flat leads 270 extending to each side of the modules as shown in the dotted position of FIG. 25 and moves rollers 364 to the dwell surfaces of cam slots 366, moving the cutters 362 back to their retracted position. No work is performed during extension and retraction of the cutters on the downstroke of the press.

Continued lowering of the press moves the arms 400 past the clamp bar and the modules so that the leads are bent down with respect to the clamped modules. During bending of the leads, the outer edges of the carrier strips are bent down free of the cutters 362. See FIG. 26. When the press is fully bottomed, the leads are bent down through nearly 90° and are closely confined between the inner surfaces of the arms 400 and the sides of the support 310. See the dotted position of FIG. 26.

As the upper press plate is raised, the forming die is also raised and, nearing the end of the upstroke, the cutters 362 are again extended toward the support 310 and cutting edges 414 are moved under shoulders 416 to sever the carrier strips 272 from the bent down leads 270. See FIG. 27. The severed strips fall away through slots 314. During cutting away of the carrier strips the substrates are clamped on the support 310 by the spring-backed pins 492. Set screw 394 limits upward pivoting of clamp bar 372 as the die is raised so that the bar strips the formed dual in-line packages from die recess 402 and assures the packages are retained on support 310. As the upper press plate nears the top of its stroke the cutters 362 and tips 334 are retracted.

The cycle of operation of the station 250 is completed upon raising of the upper press plate to the start position of FIGS. 19 and 21. The station will continue the cycle as long as there are sufficient modules in the upstream loop of the lead frame assembly. The completed DIP packages formed at station 268 are moved from the station by the downstream portion of the lead frame assembly which is fed to the station during the next cycle of operation. The packages fall down chute 396 and are collected as desired.

In the event that there are insufficient modules in the upstream loop of the lead frame assembly, the station 250 is deactivated until sufficient length of the assembly is fed into the loop from the feed 34. When that occurs, the sensor will automatically initiate operation of the station.

While I have illustrated and described preferred embodiments of my invention, it is understood that these are capable of modification, and I therefore do not wish to be limited to the precise details set forth, but desire to avail myself of such changes and alterations as fall within the purview of the following claims.

What I claim as my invention is:

1. Apparatus for manufacturing dual in-line packages from leadless circuit modules and a lead frame assembly having a pair of spaced carrier strips with inwardly facing leads; the apparatus comprising a support; loading, closing, bonding, and bending stations on the support arranged along a lead frame assembly feed path, and feed means for moving the lead frame assembly along the feed path; the loading station including a leadless circuit module feed mechanism for positioning leadless circuit modules between the ends of the leads in the assembly as the assembly is moved past the loading station; the closing station including a number of closing units spaced along the feed path, each unit having a pair of collapse surfaces on opposite sides of the feed path and engageable with the outer edges of the carrier strips in the lead frame assembly, the surfaces of the units being spaced progressively closer together downstream along the feed path so that as the lead frame assembly is moved downstream past the closing station the carrier strips are forced together to move the ends of the leads against the leadless circuit modules; the bonding station including a lead bonder operable to bond the ends of the leads to the circuit pads on the leadless circuit modules; and the bending station including a lead bender for bending the ends of leads to a dual in-line configuration.

2. Apparatus as in claim 1 wherein the bending station includes a number of bending units spaced along the feed path, each bending unit including a bending roller and a back up roller located above and below the feed path, opposed module receiving recesses in rollers, closely spaced cylindrical lead-support ridges on the rollers adjacent the recesses and engageable with the leads adjacent the modules to hold the same during lead-bending, and a pair of bending surfaces on the bending roller engageable with the portions of the leads located outwardly of the support ridges to bend the same, said surfaces extending past the circumference of the support ridges of the back up roller, the bending surfaces of downstream bending units extending at steeper angles to the axis of their respective bending rollers so that as the lead frame assembly is moved through the rollers of the bending station the leads are successively bent to a dual in-line configuration.

3. Apparatus as in claim 2 wherein the bending surfaces lie on conical surfaces.

4. An apparatus as in claim 2 including a strip cut off station located on the support downstream of the bending station and including a pair of cutters on opposite sides of the feed path operable to sever the carrier strips from the ends of the leads away from the module.

5. Apparatus as in claim 4 wherein the cut off station includes a module guide bar located on the feed path and a pair of rotary cutters located on opposite sides of the bar and having circular knives with cutting edges extending adjacent the sides of the bar to engage and sever the bent leads adjacent their junction with the carrier strips.

6. An apparatus as in claim 2 wherein the bending station includes a scoring unit located upstream of said bending units and including knives for scoring the surfaces of the leads on both sides of the modules prior to bending.

7. An apparatus as in claim 1 wherein the closing station includes a crimp unit located on the feed path downstream of the collapse units and engageable with rungs extending between the carrier strips to deform the same and hold the leads against the modules.

8. An apparatus as in claim 7 wherein the crimp unit includes spring-backed collapse surfaces engageable with the outer edges of the carrier strips during deformation of the rungs to hold the strips together and assure seating of the leads against the modules.

9. An apparatus as in claim 1 wherein each closing unit of the collapse station comprises a pair of collapse rollers located on opposite sides of the feed path, the rollers having circumferential carrier strip-receiving slots facing each other, the spacing between the bottoms of the slots of adjacent closing unit decreasing in a downstream direction.

10. Apparatus for manufacturing dual circuit packages from leadless circuit modules and a lead assembly having a pair of spaced carrier strips with inwardly facing leads; the apparatus comprising a support; loading, closing, and bonding stations on the support arranged along a lead assembly feed path, and feed means for moving the lead assembly along the feed path; the loading station including a leadless circuit module feed mechanism for positioning leadless circuit modules adjacent the ends of the leads as the assembly is moved past the loading station; the closing station including strip collapsing means on both sides of the feed path engageable with outer edges of the carrier strips and extending a distance along the feed path, the spacing between such means decreasing downstream along the feed path so that as the lead frame assembly is moved past the closing station, the carrier strips are forced together to move the ends of the leads toward the leadless circuit modules to bonding positions; and the bonding station including a lead bonder operable to bond the ends of the leads to circuit pads on the leadless circuit modules.

11. Apparatus as in claim 10 including a bending station on the support located downstream of the bonding station, such station comprising a number of bending units spaced along the feed path, each bending unit including a bending roller and a back up roller located above and below the feed path, opposed module receiving recesses in rollers, closely spaced cylindrical lead-support ridges on the rollers adjacent the recesses and engageable with the leads adjacent the modules to hold the same during lead-bending, and a pair of bending surfaces on the bending roller engageable with the portions of the leads located outwardly of the support ridges to bend the same, said surfaces extending past the circumference of the support ridges of the back up roller, the bending surfaces of downstream bending units extending at steeper angles to the axis of their respective bending rollers so that as the lead frame assembly is moved through the rollers of the bending station the leads are successively bent to a dual in-line configuration.

12. An apparatus as in claim 11 including a strip cut off station located on the support downstream of the bending station including a pair of cutters on opposite sides of the feed path operable to sever the carrier strips from the ends of the leads away from the module.

13. An apparatus as in claim 10 wherein the closing station includes a number of pairs of collapse rollers located on opposite sides of the feed path and spaced along the feed path, the rollers having circumferential carrier strip-receiving slots facing each other, the spacing between slots of adjacent units decreasing in a downstream direction.

* * * * *